US009685408B1

(12) United States Patent
Jiang et al.

(10) Patent No.: US 9,685,408 B1
(45) Date of Patent: Jun. 20, 2017

(54) CONTACT PAD STRUCTURE AND METHOD FOR FABRICATING THE SAME

(71) Applicant: MACRONIX International Co., Ltd., Hsinchu (TW)

(72) Inventors: Yu-Wei Jiang, Hsinchu (TW); Teng-Hao Yeh, Hsinchu (TW); Chia-Jung Chiou, Hsinchu (TW); Chih-Yao Lin, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/362,718

(22) Filed: Nov. 28, 2016

Related U.S. Application Data

(63) Continuation-in-part of application No. 15/099,316, filed on Apr. 14, 2016, now Pat. No. 9,508,645.

(51) Int. Cl.
| | | |
|---|---|---|
| H01L 21/44 | (2006.01) |
| H01L 23/528 | (2006.01) |
| H01L 23/522 | (2006.01) |
| H01L 27/115 | (2017.01) |
| H01L 27/11551 | (2017.01) |
| H01L 27/11578 | (2017.01) |
| H01L 27/11526 | (2017.01) |
| H01L 27/11573 | (2017.01) |

(52) U.S. Cl.
CPC ........ *H01L 23/528* (2013.01); *H01L 23/5226* (2013.01); *H01L 27/115* (2013.01); *H01L 27/11526* (2013.01); *H01L 27/11551* (2013.01); *H01L 27/11573* (2013.01); *H01L 27/11578* (2013.01)

(58) Field of Classification Search
CPC ............. H01L 27/115; H01L 27/11573; H01L 27/11578; H01L 27/11526; H01L 27/11551; H01L 23/528; H01L 23/5283; H01L 23/5226; H01L 23/49811; H01L 23/49827; H01L 23/4952; H01L 23/488; H01L 23/5221; H01L 23/48
See application file for complete search history.

(56) References Cited

U.S. PATENT DOCUMENTS

| | | |
|---|---|---|
| 9,196,567 B1 | 11/2015 | Chan |
| 2014/0374149 A1 | 12/2014 | Sanada et al. |
| 2017/0040254 A1* | 2/2017 | Hwang ............ H01L 27/11524 |

* cited by examiner

*Primary Examiner* — (Vikki) Hoa B Trinh
(74) *Attorney, Agent, or Firm* — J.C. Patents

(57) ABSTRACT

A contact pad structure includes alternately stacked N insulating layers (N≥6) and N conductive layers, and has N regions arranged in a 2D array exposing the respective conductive layers. When the conductive layers are numbered as first to N-th from bottom to top, the number (Ln) of exposed conductive layer decreases in a column direction in the regions of any row, the difference in Ln is fixed between two neighboring rows of regions, Ln decreases from the two ends toward the center in the regions of any column, and the difference in Ln is fixed between two neighboring columns of regions.

12 Claims, 9 Drawing Sheets

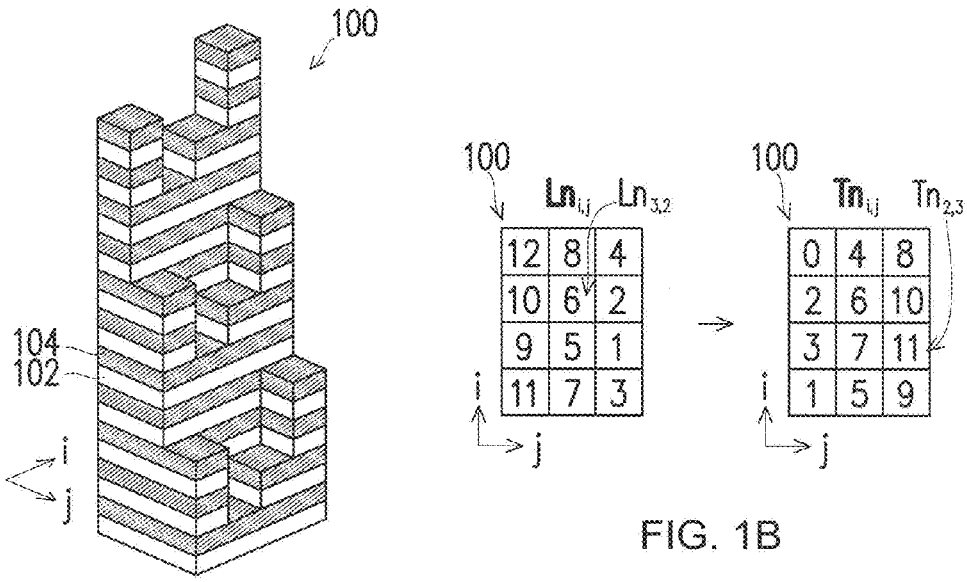
FIG. 1A
FIG. 1B
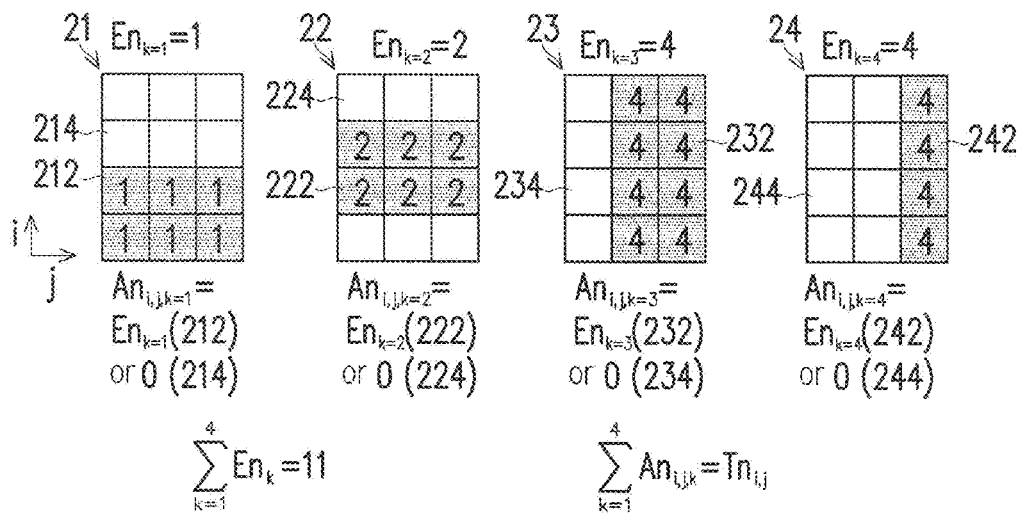
FIG. 2

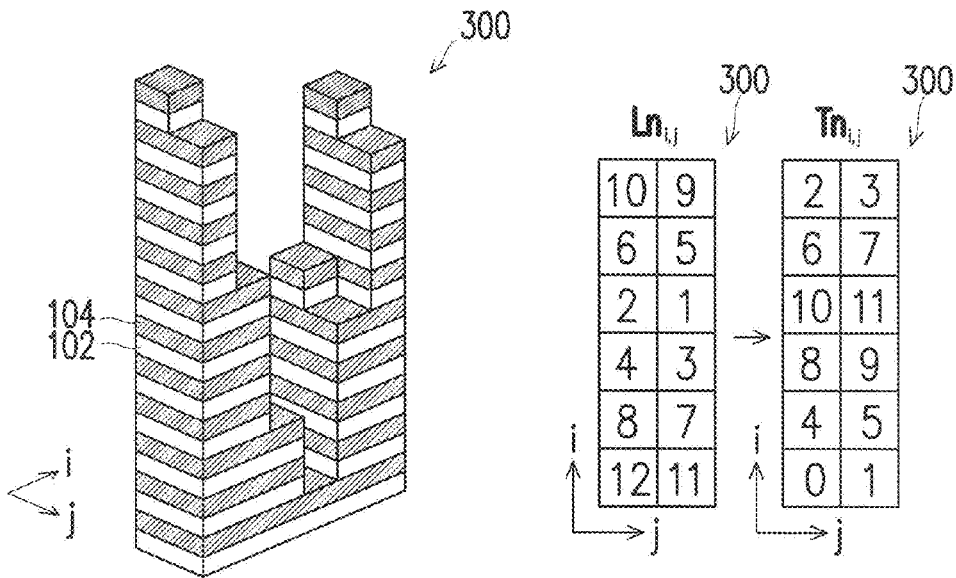
FIG. 3A
FIG. 3B
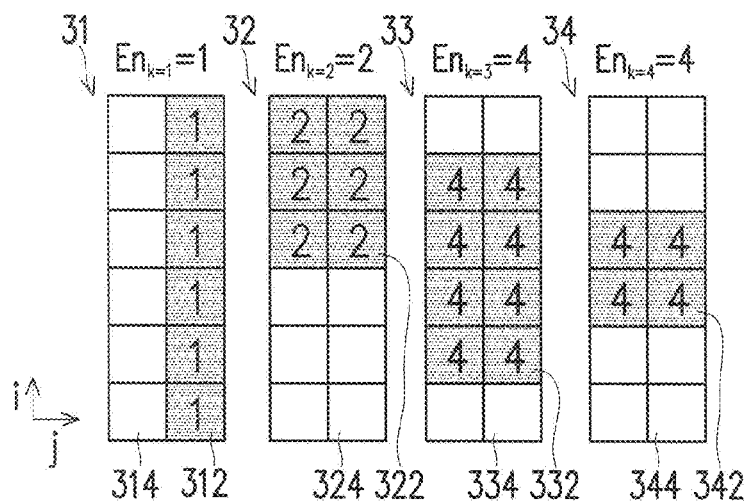
$An_{i,j,k=1}=$  $An_{i,j,k=2}=$  $An_{i,j,k=3}=$  $An_{i,j,k=4}=$
$En_{k=1}(312)$  $En_{k=2}(322)$  $En_{k=3}(332)$  $En_{k=2}(342)$
or 0 (314)  or 0 (324)  or 0 (334)  or 0 (344)
$$\sum_{k=1}^{4} En_k = 11 \qquad \sum_{k=1}^{4} An_{i,j,k} = Tn_{i,j}$$
FIG. 4

US 9,685,408 B1

CONTACT PAD STRUCTURE AND METHOD FOR FABRICATING THE SAME

CROSS-REFERENCE TO RELATED APPLICATION

This application is a continuation-in-part (CIP) application of U.S. application Ser. No. 15/099,316, filed on Apr. 14, 2016, now allowed. The entirety of the aforementioned patent application is hereby incorporated by reference herein and made a part of this specification.

BACKGROUND OF THE INVENTION

Field of Invention

This invention relates to a structure applicable to integrated circuits and its fabrication, and particularly relates to a contact pad structure for electrical connections of multiple levels of conductors, and a method for fabricating the contact pad structure.

Description of Related Art

In a three-dimensional (3D) device array, such as a 3D memory, the conductive lines of the respective levels of devices need electrical connection, so the conductive layers of the respective levels have to be exposed in a contact area for later electrical connection. As a result, a staircase contact pad structure is formed.

In order to form a staircase contact pad structure for N levels of devices, conventionally, N−1 photomasks are used to perform N−1 lithography and etching processes to remove different numbers of levels of conductive layers from N−1 regions in the contact area. However, such method is quite tedious and needs accurate process control for the tight pitch, so the manufacture cost and the process difficulty are increased.

SUMMARY OF THE INVENTION

Accordingly, this invention provides a contact pad structure that can be formed with much less than N−1 times of lithography and etching processes for N levels of devices.

This invention also provides a method for fabricating the contact pad structure of this invention.

The contact pad structure of this invention comprises alternately stacked N insulating layers (N≥6) and N conductive layers, and has N regions exposing the respective conductive layers. The regions are arranged in a P×Q array (P≥3, Q≥2). When the conductive layers are numbered from first to N-th from bottom to top and the conductive layer exposed in a region (i, j) is designated as an $Ln_{i,j}$-th conductive layer, in the Q regions in the i-th row, $Ln_{i,j}$ decreases with increase of the j value, satisfying the relationships of $Ln_{i,1} > Ln_{i,2} > \ldots > Ln_{i,Q}$, a difference in Ln between the Q regions of the i-th row and the Q regions of the (i+1)-th row is fixed, satisfying the relationship of $$Ln_{i,1}-Ln_{i+1,1}=Ln_{i,2}-Ln_{i+1,2}= \ldots =Ln_{i,Q}-Ln_{i+1,Q},$$

in the P regions of the j-th column, $Ln_{i,j}$ decreases from two ends toward a center, satisfying the relationship of $Ln_{1,j}$, $Ln_{P,j} > Ln_{2,j}$, $Ln_{P-1,j} > \ldots$, and a difference in Ln between the P regions of the j-th column and the P regions of the (j+1)-th column is fixed, satisfying the relationship of $$Ln_{1,j}-Ln_{1,j+1}=Ln_{2,j}-Ln_{2,j+1}= \ldots =Ln_{P,j}-Ln_{P,j+1}.$$

In a first embodiment of the contact pad structure, substantially no insulating layer or conductive layer higher than the $Ln_{i,j}$-th conductive layer is present in the region (i, j).

In a second embodiment of the contact pad structure, in the region (i, j) other than the region exposing the N-th conductive layer, the $Ln_{i,j}$-th conductive layer is exposed in a contact hole formed in upper layers among the insulating layers and the conductive layers.

The contact pad structure of this invention may be disposed in a 3D memory.

In another embodiment of the contact pad structure, the difference in Ln between the P regions of the j-th column and the P regions of the (j+1)-th column is fixed, satisfying the relationship of $$Ln_{1,j}-Ln_{1,j+1}=Ln_{2,j}-Ln_{2,j+1}= \ldots =Ln_{P,j}-Ln_{P,j+1}=P,$$
and in the P regions of the j-th column, $|Ln_{i,j}-Ln_{i+1,j}|≤2$, and the P regions form an asymmetric structure having a concave shape or a protrusion shape.

A method for fabricating the contact pad structure of the above embodiment in the case that the resulting asymmetric structure has a concave shape include:

removing one conductive layer, while the regions (2, j) to (1+n, j) (j=1 to Q) are targeted regions, wherein n is P/2 when P is an even number, or is (P−1)/2 when P is an odd number;

d step(s) of removing two conductive layers while the regions (2+b, j) to (1+n+b, j) (j=1 to Q) are targeted regions, wherein d is the integer part of (P−1)/2, and b is a different integer among the integers of 1 to d in each of the d step(s); and Q−1 step(s) of removing P conductive layers while the regions (i, 1+c) to (i, Q) (i=1 to P) are targeted regions, wherein c is a different integer among the integers of 1 to Q−1, wherein the targeted regions are exposed and etched.

A method for fabricating the contact pad structure of the above embodiment in the case that the resulting asymmetric structure has a protrusion shape include:

removing one conductive layer, while the regions (2, j) to (1+n, j) (j=1 to Q) are targeted regions, in which n=P/2, when P is an even number, or while the regions (1, j) to (n, j) (j=1 to Q) are targeted regions, in which n=(P+1)/2, when P is an odd number;

d step(s) of removing two conductive layers, while the regions (2+b, j) to (1+n+b, j) (j=1 to Q) (n=P/2) are targeted regions when P is an even number, or while the regions (1+b, j) to (n+b, j) (j=1 to Q) (n=(P+1)/2) are targeted regions when P is an odd number, wherein d is an integer part of (P−1)/2, and b is a different integer among the integers of 1 to d in each of the d step(s); and Q−1 step(s) of removing P conductive layers while the regions (i, 1+c) to (i, Q) (i=1 to P) are targeted regions, wherein c is a different integer among the integers of 1 to Q−1, wherein the targeted regions are masked.

Because the contact pad structure of this invention can be formed with much less than N−1 times of lithography and etching processes for N levels of devices, the formation process can be significantly simplified, and the process control is easier.

Moreover, when the aforementioned asymmetric structure has a concave shape, the topology height difference is minor, especially in the ADT boundary, and the area of each staircase can be divided equally well. When the asymmetric structure has a protrusion shape and is disposed on a surface lower than adjacent surfaces, the protrusion structure can divide the wide trench to avoid dishing issue by a subsequent CMP process.

In order to make the aforementioned and other objects, features and advantages of this invention comprehensible, a preferred embodiment accompanied with figures is described in detail below.

BRIEF DESCRIPTION OF THE DRAWINGS

FIG. 1A illustrates a perspective view of a contact pad structure of an example according to a first embodiment of this invention.

FIG. 1B illustrates a top view of the contact pad structure illustrated in FIG. 1A, wherein the number $Ln_{i,j}$ of the conductive layer exposed in each region and the number $Tn_{i,j}$ of the conductive layer(s) requiring to be removed in each region are shown.

FIG. 2 illustrates an exemplary combination of photomask patterns and numbers of etched conductive layers that is capable of achieving the $Tn_{i,j}$ distribution shown in FIG. 1B.

FIG. 3A illustrates a perspective view of a contact pad structure of another example according to the first embodiment of this invention.

FIG. 3B illustrates a top view of the contact pad structure illustrated in FIG. 3A, wherein the number $Ln_{i,j}$ of the conductive layer exposed in each region and the number $Tn_{i,j}$ of the conductive layer(s) requiring to be removed in each region are shown.

FIG. 4 illustrates an exemplary combination of photomask patterns and numbers of etched conductive layers that is capable of achieving the $Tn_{i,j}$ distribution shown in FIG. 3B.

DESCRIPTION OF EMBODIMENTS

Figure 5A:
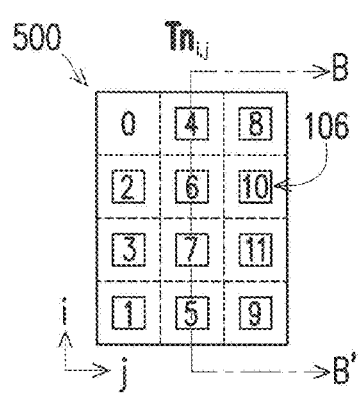
FIG. 5A illustrates a top view of a contact pad structure of an example according to a second embodiment of this invention, wherein the number $Tn_{i,j}$ of the conductive layer(s) requiring to be removed in each region is shown.

This invention is further explained with the following embodiments, which are just exemplary but are not intended to limit the scope of this invention.

FIG. 1A illustrates a perspective view of a contact pad structure of an example according to the first embodiment of this invention. FIG. 1B illustrates a top view of the contact pad structure illustrated in FIG. 1A, wherein the number $Ln_{i,j}$ of the conductive layer exposed in each region and the number $Tn_{i,j}$ of the conductive layer(s) requiring to be removed in each region are shown. In the first embodiment of this invention, substantially no insulating layer or conductive layer higher than the $Ln_{i,j}$-th conductive layer is present in the region (i, j).

Referring to FIG. 1A and FIG. 1B, in the contact pad structure 100 of this example, 12 insulating layers 102 and 12 conductive layers 104 are alternately stacked, and the 12 regions exposing the respective conductive layers 104 are arranged in a 4×3 array. This corresponds to a case of N=12, P=4 and Q=3. The column direction and the row direction are designated as i-direction and j-direction, respectively, in the figures, but the i-direction and the j-direction are not necessarily the x-direction and the y-direction, or the y-direction and the x-direction, respectively, of the wafer. The conductive layers 104 are numbered as from first to 12-th (=N-th) from bottom to top. The number $Ln_{i,j}$ of the conductive layer exposed in each region (i, j) (i=1~4, j=1~3) is shown in the left half of FIG. 1B, for example, $Ln_{3,2}=6$ for the region (3, 2). In the 3 (=Q) regions in the i-th row, $Ln_{i,j}$ decreases with increase of the j-value, satisfying the relationships of $Ln_{i,1}>Ln_{i,2}>Ln_{i,3}$. The difference in Ln between the 3 (=Q) regions of the i-th row and the 3 (=Q) regions of the (i+1)-th row is fixed, satisfying the relationship of $Ln_{i,1}-Ln_{i+1,1}=Ln_{i,2}-Ln_{i+1,2}=Ln_{i,3}-Ln_{i+1,3}$. In the 4 (=P) regions in the j-th column, $Ln_{i,j}$ decreases from the two ends toward the center, satisfying the relationship of $Ln_{1,j}$, $Ln_{4,j}>Ln_{2,j}$, $Ln_{3,j}$. In addition, the difference in Ln between the 4 (=P) regions of the j-th column and the 4 (=P) regions of the (j+1)-th column is fixed, satisfying the relationship of $$Ln_{1,j}-Ln_{1,j+1}=Ln_{2,j}-Ln_{2,j+1}=Ln_{3,j}-Ln_{3,j+1}=Ln_{4,j}-Ln_{4,j+1}.$$

In order to achieve the $Ln_{i,j}$ distribution and the structure that substantially no insulating layer or conductive layer higher than the $Ln_{i,j}$-th conductive layer is present in the region (i, j), a certain number $Tn_{i,j}(=N-Ln_{i,j}=12-Ln_{i,j})$ of conductive layer(s) is required to be removed substantially completely in each region (i, j), and the $Tn_{i,j}$ distribution is shown in the right half of FIG. 1B. For example, in the region (2, 3), 11 conductive layers have to be removed to expose the first conductive layer, and $Tn_{2,3}=11$. The $Tn_{i,j}$ distribution can be achieved by using much less than N−1 (11) photomasks to perform the same number (M) of lithography and etching processes, with a certain combination of photomask patterns and numbers of etched conductive layers. An example of such combination is illustrated in FIG. 2.

Referring to FIG. 2, this example uses four photomasks (a case of M=4), which have photomask patterns 21, 22, 23 and 24, respectively, in the correspond area, and the order of use can be arbitrarily selected.

The photomask pattern 21 includes removal regions 212 corresponding to the pad regions where one or more conductive layers are to be removed, and non-removal regions 214 corresponding to the pad regions where no conductive layer is to be removed, wherein the removal regions 212 and non-removal regions 214 are distributed as shown in the figure. In the lithography and etching process using the photomask pattern 21, the number $En_{k=1}$ of to-be-etched conductive layer is "1", the number $An_{i,j,k=1}$ of to-be-etched conductive layer in a pad region (i, j) corresponding to a removal region 212 is $En_{k=1}$ (1), and the $An_{i,j,k=1}$ value for a pad region (i, j) corresponding to a non-removal region 214 is 0.

The photomask pattern 22 includes removal regions 222 corresponding to the pad regions where one or more conductive layers are to be removed, and non-removal regions 224 corresponding to the pad regions where no conductive layer is to be removed, wherein the removal regions 222 and non-removal regions 224 are distributed as shown in the figure. In the lithography and etching process using the photomask pattern 22, the number $En_{k=2}$ of to-be-etched conductive layers is "2", the number $An_{i,j,k=2}$ of to-be-etched conductive layers in a pad region (i, j) corresponding to a removal region 222 is $En_{k=2}$ (2), and the $An_{i,j,k=2}$ value for a pad region (i, j) corresponding to a non-removal region 224 is 0.

The photomask pattern 23 includes removal regions 232 corresponding to the pad regions where one or more conductive layers are to be removed, and non-removal regions 234 corresponding to the pad regions where no conductive layer is to be removed, wherein the removal regions 232 and the non-removal regions 234 are distributed as shown in the figure. In the lithography and etching process using the photomask pattern 23, the number $En_{k=3}$ of to-be-etched conductive layer is "4", the number $An_{i,j,k=3}$ of to-be-etched conductive layers in a pad region (i, j) corresponding to a removal region 232 is $En_{k=3}$ (4), and the $An_{i,j,k=3}$ value for a pad region (i, j) corresponding to a non-removal region 234 is 0.

The photomask pattern 24 includes removal regions 242 corresponding to the pad regions where one or more conductive layers are to be removed, and non-removal regions 244 corresponding to the pad regions where no conductive layer is to be removed, wherein the removal regions 242 and non-removal regions 244 are distributed as shown in the figure. In the lithography and etching process using the photomask pattern 24, the number $En_k=4$ of to-be-etched conductive layer is "4", the number $An_{i,j,k=4}$ of to-be-etched conductive layers in a pad region (i, j) corresponding to a removal region 242 is $En_{k=4}$ (4), and the $An_{i,j,k=4}$ value for a pad region (i, j) corresponding to a non-removal region 244 is 0.

The sum of the numbers of to-be-etched conductive layer(s) of the 4 (=M) lithography and etching processes is N−1 (11); that is, the sum of $En_{k=1}$, $En_{k=2}$, $En_{k=3}$ and $En_{k=M=4}$ is N−1 (11). The cumulative number of removed conductive layer(s) in each region (i, j) after the M lithography and etching processes is equal to the above number $Tn_{i,j}$ of the conductive layer(s) requiring to be removed in the region (i, j); that is, the sum of $An_{i,j,k=1}$, $An_{i,j,k=2}$, $An_{i,j,k=3}$ and $An_{i,j,k=M=4}$ is $Tn_{i,j}$. For example, the pad region (2, 2) corresponds to a removal region 212 in the photomask pattern 21, a removal region 222 in the photomask pattern 22, a removal region 232 in the photomask pattern 23, and a non-removal region 244 in the photomask pattern 24, namely $An_{2,2,k=1}=En_{k=1}=$, $An_{2,2,k=2}=En_{k=2=2}$, $An_{2,2,k=3}=En_{k=3=4}$ and $An_{2,2,k=M=4}=0$, the sum of which is $Tn_{2,2}=7$ (FIG. 1B).

In addition, the conductive layers 104 may include a metal material, N-doped polysilicon, P-doped polysilicon, or a combination thereof, and the insulating layers 102 may include silicon oxide, silicon nitride, silicon oxynitride, or a combination thereof.

After the contact pad structure 100 in which the respective conductive layers 104 are exposed is formed, it is possible to form an upper insulating layer (not shown) over it and then form in the same a plurality of contact plugs (not shown) having different depths to electrically connect the respective conductive layers 104 in the contact pad structure 100.

FIG. 3A illustrates a perspective view of a contact pad structure of another example according to the first embodiment of this invention. FIG. 3B illustrates a top view of the contact pad structure illustrated in FIG. 3A, wherein the number $Ln_{i,j}$ of the conductive layer exposed in each region and the number $Tn_{i,j}$ of the conductive layer(s) requiring to be removed in each region are shown.

Referring to FIGS. 3A and 3B, the contact pad structure 300 of this example also includes 12 conductive layers, but the 12 regions exposing the respective conductive layers 104 are arranged in a 6×2 array. This corresponds to a case of N=12, P=6 and Q=2. The i-direction and the j-direction are defined as above.

The number $Ln_{i,j}$ of the conductive layer exposed in each region (i, j) (i=1–6, j=1–2) is shown in the left part of FIG. 3B. In the 2 (=Q) regions in the i-th row, $Ln_{i,j}$ decreases with increase of the j-value, satisfying the relationship of $Ln_{i,1}>Ln_{i,2}$. The difference in Ln between the 2 (=Q) regions of the i-th row and the 2 (=Q) regions of the (i+1)-th row is fixed, satisfying the relationship of $Ln_{i,1}-Ln_{i+1,1}=Ln_{i,2}-Ln_{i+1,2}$. In the 6 (=P) regions in the j-th column, $Ln_{i,j}$ decreases from the two ends toward the center, satisfying the relationship of $Ln_{1,j}, Ln_{6,j}>Ln_{2,j}, Ln_{5,j}>Ln_{3,j}, Ln_{4,j}$. In addition, the difference in Ln between the 6 (=P) regions of the $1^{st}$ column and the 6 (=P) regions of the $2^{nd}$ column is fixed, satisfying the relationship of $$Ln_{1,1}-Ln_{1,2}=Ln_{2,1}-Ln_{2,2}=Ln_{3,1}-Ln_{3,2}=Ln_{4,1}-Ln_{4,2}=Ln_{5,1}-Ln_{5,2}=Ln_{6,1}-Ln_{6,2}.$$

The number $Tn_{i,j}(=N-Ln_{i,j}=12-Ln_{i,j})$ of the conductive layer(s) requiring to be removed substantially completely in each region (i, j) in order to achieve the $Ln_{i,j}$ distribution and the structure that substantially no insulating layer or conductive layer higher than the $Ln_{i,j}$-th conductive layer is present in the region (i, j) is shown in the right part of FIG. 3B. The $Tn_{i,j}$ distribution can be achieved by using much less than N−1 (11) photomasks to perform the same number (M) of lithography and etching processes, with a certain combination of photomask patterns and numbers of etched conductive layers. An example of such combination is illustrated in FIG. 4.

A shown in FIG. 4, this example uses four photomasks (a case of M=4), which have photomask patterns 31, 32, 33 and 34, respectively, in the correspond area, and the order of use can be arbitrarily selected.

The photomask pattern 31 includes removal regions 312 corresponding to the pad regions where one or more conductive layers are to be removed, and non-removal regions 314 corresponding to the pad regions where no conductive layer is to be removed, wherein the removal regions 312 and non-removal regions 314 are distributed as shown in the figure. In the lithography and etching process using the photomask pattern 31, the number $En_{k=1}$ of to-be-etched conductive layer is "1", the number $An_{i,j,k=1}$ of to-be-etched conductive layer in a pad region (i, j) corresponding to a removal region 312 is $En_{k=1}$ (1), and the $An_{i,j,k=1}$ value for a pad region (i, j) corresponding to a non-removal region 314 is 0.

The photomask pattern 32 includes removal regions 322 corresponding to the pad regions where one or more conductive layers are to be removed, and non-removal regions 324 corresponding to the pad regions where no conductive layer is to be removed, wherein the removal regions 322 and non-removal regions 324 are distributed as shown in the figure. In the lithography and etching process using the photomask pattern 32, the number $En_{k=2}$ of to-be-etched conductive layers is "2", the number $An_{i,j,k=2}$ of to-be-etched conductive layers in a pad region (i, j) corresponding to a removal region 322 is $En_{k=2}$ (2), and the $An_{i,j,k=2}$ value for a pad region (i, j) corresponding to a non-removal region 324 is 0.

The photomask pattern 33 includes removal regions 332 corresponding to the pad regions where one or more conductive layers are to be removed, and non-removal regions 334 corresponding to the pad regions where no conductive layer is to be removed, wherein the removal regions 332 and the non-removal regions 334 are distributed as shown in the figure. In the lithography and etching process using the photomask pattern 33, the number $En_{k=3}$ of to-be-etched conductive layer is "4", the number $An_{i,j,k=3}$ of to-be-etched conductive layers in a pad region (i, j) corresponding to a removal region 332 is $En_{k=3}$ (4), and the $An_{i,j,k=3}$ value for a pad region (i, j) corresponding to a non-removal region 334 is 0.

The photomask pattern 34 includes removal regions 342 corresponding to the pad regions where one or more conductive layers are to be removed, and non-removal regions 344 corresponding to the pad regions where no conductive layer is to be removed, wherein the removal regions 342 and non-removal regions 344 are distributed as shown in the figure. In the lithography and etching process using the photomask pattern 34, the number $En_{k=4}$ of to-be-etched conductive layer is "4", the number $An_{i,j,k=4}$ of to-be-etched conductive layers in a pad region (i, j) corresponding to a removal region 342 is $En_{k=4}$ (4), and the $An_{i,j,k=4}$ value for a pad region (i, j) corresponding to a non-removal region 344 is 0.

The sum of the numbers of to-be-etched conductive layer(s) of the 4 (=M) lithography and etching processes is N−1 (11); that is, the sum of $En_{k=1}$, $En_{k=2}$, $En_{k=3}$ and $En_{k=M=4}$ is N−1 (11). The cumulative number of removed conductive layer(s) in each region (i, j) after the M lithography and etching processes is equal to the above number $Tn_{i,j}$ of the conductive layer(s) requiring to be removed in the region (i, j); that is, the sum of $An_{i,j,k=1}$, $An_{i,j,k=2}$, $An_{i,j,k=3}$ and $An_{i,j,k=M=4}$ is $Tn_{i,j}$. For example, the pad region (2, 2) corresponds to a removal region 312 in the photomask pattern 31, a non-removal region 324 in the photomask pattern 32, a removal region 332 in the photomask pattern 33, and a non-removal region 344 in the photomask pattern 34, namely $An_{2,2,k=1}=En_{k=1}=1$, $An_{2,2,k=2}=0$, $An_{2,2,k=3}=En_{k=3}=4$ and $An_{2,2,k=M=4}=0$, the sum of which is $Tn_{2,2}=5$.

Figure 5B:
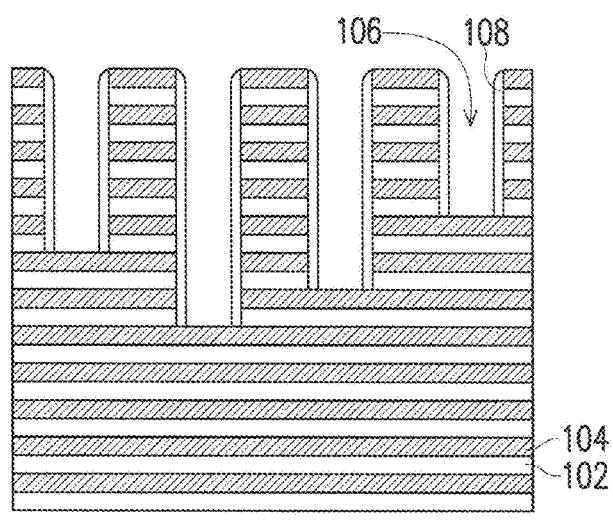
FIG. 5B illustrates a B-B' cross-sectional view of a contact pad structure of FIG. 5A.

FIG. 5A illustrates a top view of a contact pad structure of an example according to a second embodiment of this invention, wherein the number $Tn_{i,j}$ of the conductive layer(s) requiring to be removed in each region is shown. FIG. 5B illustrates a B-B' cross-sectional view of the contact pad structure illustrated in FIG. 5A.

Referring to FIGS. 5A and 5B, the $Tn_{i,j}$ distribution of the contact pad structure 500 is the same as that shown in FIG. 1B, and the combination of photomask pattern distributions and numbers of etched conductive layers for its formation may be the same as that shown in FIG. 2. However, in any region (i, j) other than the region exposing the upmost N-th conductive layer, each insulating layer 102 and each conductive layer 104 above the $Ln_{i,j}$-th conductive layer is merely partially removed in the M lithography and etching processes, so that a contact hole 106 is formed in the layers 102 and 104 above the $Ln_{i,j}$-th conductive layer and the $Ln_{i,j}$-th conductive layer is exposed in the contact hole 106.

After the M lithography and etching processes, a spacer 108 may be formed on the sidewall of each contact hole 106, so that the contact plug of the $Ln_{i,j}$-th conductive layer that will be formed later in the contact hole 106 in the region (i, j) can be insulated from the conductive layer(s) 104 above the region (i, j) $Ln_{i,j}$-th conductive layer. The spacer 108 may include silicon oxide, silicon nitride, silicon oxynitride, or a combination thereof.

The above contact pad structure 100, 300 or 500 of the above embodiments may be disposed in a 3D memory.

Figure 6:
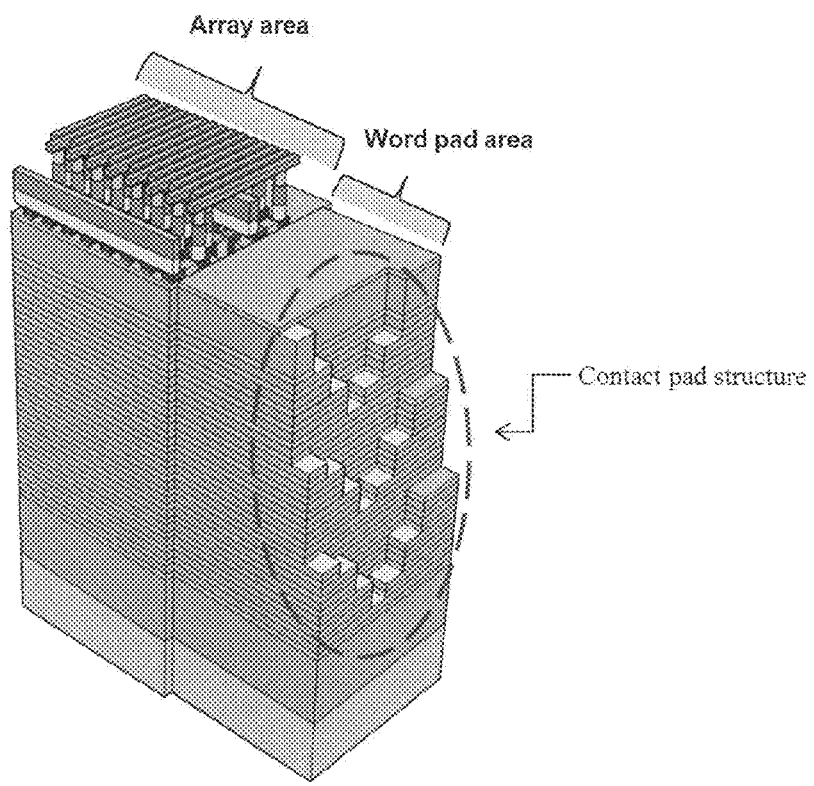
FIG. 6 illustrates a perspective view of an example of a 3D-memory structure including a contact pad structure according to an embodiment of this invention.

In addition, the contact pad structure of this invention can be disposed adjacent to a word-line pad in a 3D memory. FIG. 6 illustrates a perspective view of an example of such 3D-memory structure of an embodiment of this invention.

In another embodiment of the contact pad structure, in the Q regions in the i-th row, the difference in Ln between the P regions of the j-th column and the P regions of the (j+1)-th column is fixed, satisfying the relationship of $Ln_{1,j}-Ln_{1,j+1}=Ln_{2,j}-Ln_{2,j+1}=\ldots=Ln_{P,j}-Ln_{P,j+1}=P$; and in the P regions of the j-th column, $|Ln_{i,j}-Ln_{i+1,j}|\leq 2$, and the P regions form an asymmetric structure having a concave shape or a protrusion shape.

An example of a concave shape of the asymmetric structure of the contact regions in the same column is illustrated in FIG. 6.

Figures 7A, 7B:
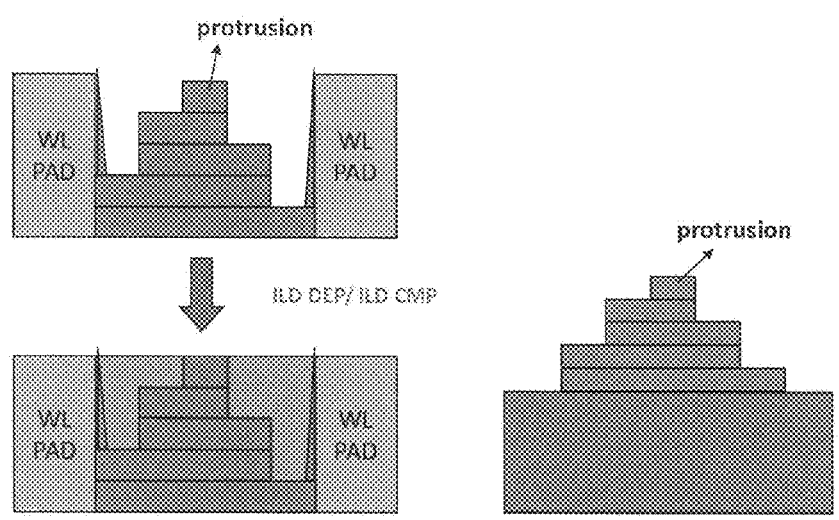
FIGS. 7A and 7B illustrate two examples of the protrusion shape of the asymmetric structure of the contact regions in the same column, wherein the asymmetric structure having the protrusion shape is disposed on a surface lower than adjacent surfaces (FIG. 7A), or on a surface coplanar with adjacent surfaces (FIG. 7B).

As for the case of the protrusion shape, an asymmetric structure having the protrusion shape may be disposed on a surface lower than adjacent surfaces, as shown in FIG. 7A, or alternatively be disposed on a surface coplanar with adjacent surfaces as shown in FIG. 7B. The adjacent surfaces may be top surfaces of the word-line pad of a 3D memory. When the asymmetric structure has a protrusion shape and is disposed on a surface lower than adjacent surfaces, the protrusion structure can divide the wide trench to avoid dishing issue by a subsequent CMP process. When the asymmetric structure has a protrusion shape and is disposed on a surface coplanar with adjacent surfaces, the topology height difference is minor, and the area of each staircase can be divided equally well.

Figure 8:
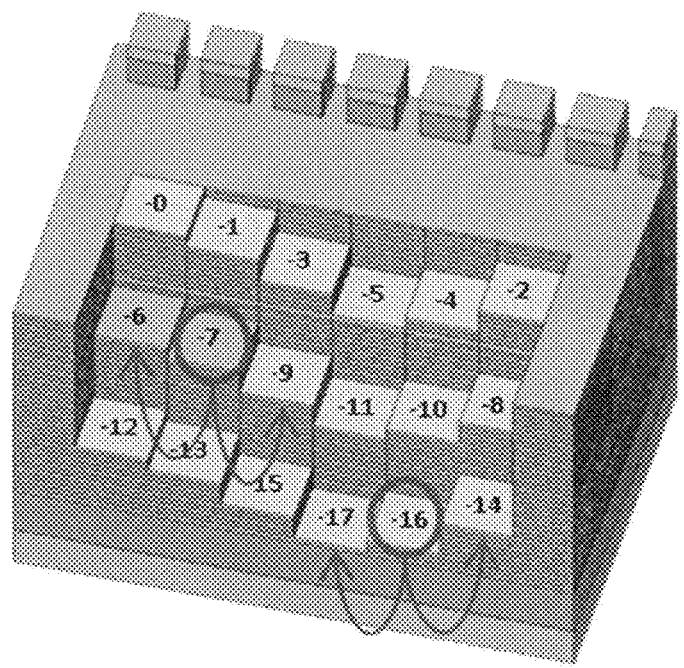
FIG. 8 illustrates an example of the concave shape of the contact regions that meets the requirement of $|Ln_{i,j}-Ln_{i+1,j}|\leq 2$, wherein each number is the number $Tn_{i,j}$ of the conductive layers being removed in the corresponding contact region.
Figure 9:
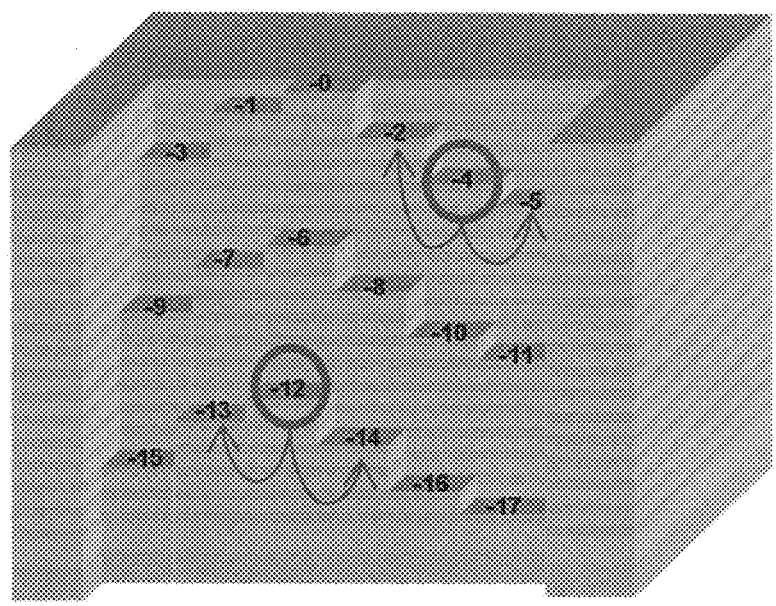
FIG. 9 illustrates an example of the protrusion shape of the contact regions that meets the requirement of $|Ln_{i,j}-Ln_{i+1,j}|\leq 2$, wherein each number is the number $Tn_{i,j}$ of the conductive layers being removed in the corresponding contact region.

With respect to the above requirement of $|Ln_{i,j}-Ln_{i+1,j}|\leq 2$ in the P regions of the same column, FIG. 8 illustrates an example of the concave shape of the contact regions that meets the requirement, and FIG. 9 illustrates an example of the protrusion shape of the contact regions that meets the requirement, wherein each number is the number $Tn_{i,j}$ of the conductive layers being removed in the corresponding contact region.

The contact pad structure of the above embodiment in the case that the asymmetric structure has a concave shape may be fabricated with a method including the following steps: removing one conductive layer while the regions (2, j) to (1+n, j) (j=1 to Q) are targeted regions, wherein n is P/2 when P is an even number, or is (P−1)/2 when P is an odd number; d step(s) of removing two conductive layers while the regions (2+b, j) to (1+n+b, j) (j=1 to Q) are targeted regions, wherein d is the integer part of (P−1)/2, and b is a different integer among the integers of 1 to d in each of the d step(s); and Q−1 step(s) of removing P conductive layers while the regions (i, 1+c) to (i, Q) (i=1 to P) are targeted regions, wherein c is a different integer among the integers of 1 to Q−1. The targeted regions are exposed and etched. The method can be applied to manufacture of a 3D memory.

Figure 10A:
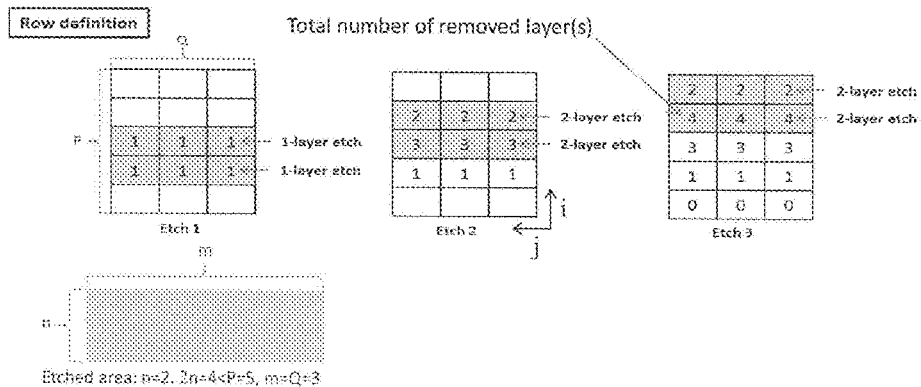
FIGS. 10A and 10B illustrate a method for fabricating a contact pad structure according to an embodiment where P=5 and a concave shape is formed.
Figure 10B:
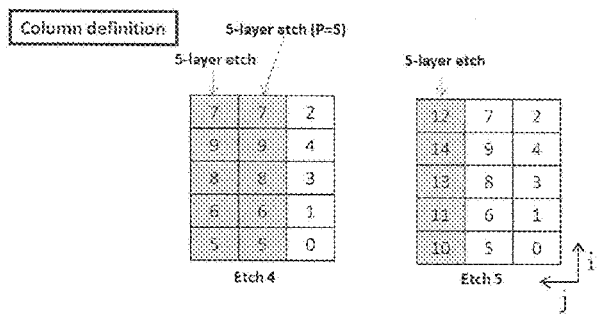

FIGS. 10A and 10B illustrate a method for fabricating a contact pad structure according to an embodiment where P=5 and a concave shape is formed.

The steps include row definition steps and column definition steps, but these definition steps can be performed in any order. When the row number is P=5, n=2 (=(P−1)/2 as P is an odd number), and d is the integer part (2) of (P−1)/2 (=2), which means that the row definition steps include two (=d) 2-layer etching steps and two (=n) rows of regions are etched in each of the 1-layer etching step and the two (=d) 2-layer etching steps. In addition, Q=3 in this example, so m=Q=3 columns of regions are etched in each of the 1-layer etching step and the two 2-layer etching steps. The column definition steps include Q−1=2 steps, each of which removes P conductive layers and is a P-layer etching step, and c ranges from 1 to 2. In the column definition step of c=1, the regions (i, 1+1=2) to (i, Q=3) (i=1 to P) are targeted. In the column definition step of c=2, the regions (i, 1+2=Q=3) (i=1 to P) are targeted. The number $Tn_{i,j}$ of the conductive layer(s) being removed in each region is also shown in the figure.

Figure 11:
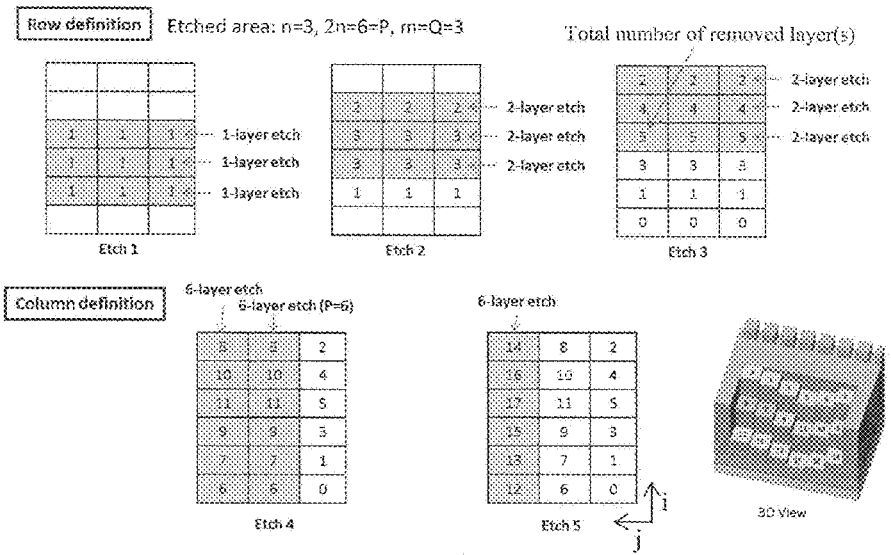
FIG. 11 illustrates a method for fabricating a contact pad structure according to an embodiment where P=6 and a concave shape is formed.

FIG. 11 illustrates a method for fabricating a contact pad structure according to an embodiment where P=6 and a concave shape is formed.

When P=6, n=3 (=P/2 as P is an even number), and d is the integer part (2) of (P−1)/2=2.5, which means that the row definition steps include two (=d) 2-layer etching steps and three (=n) rows of regions are etched in each of the 1-layer etching step and the two (=d) 2-layer etching steps. In addition, Q=3 in this example, so the m values and the column definition steps are the same as the above example.

Figure 12:
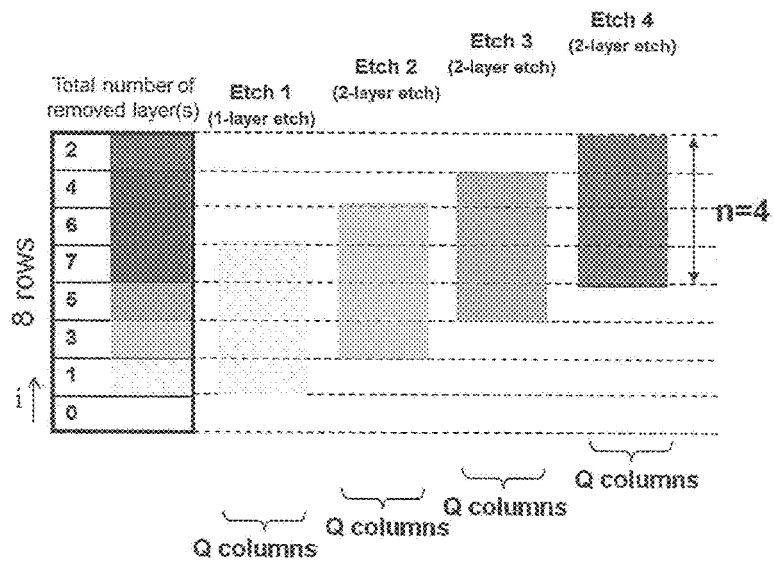
FIG. 12 illustrates the row definition steps of a method for fabricating a contact pad structure according to an embodiment where P=8 and a concave shape is formed.

FIG. 12 illustrates the row definition steps of a method for fabricating a contact pad structure according to an embodiment where P=8 and a concave shape is formed.

When P=8, n=4 (=P/2 as P is an even number), and d is the integer part (3) of (P−1)/2=3.5, which means that the row definition steps include three (=d) 2-layer etching steps and 4 (=n) rows of regions are etched in each of the 1-layer etching step and the three (=d) 2-layer etching steps.

Figure 13:
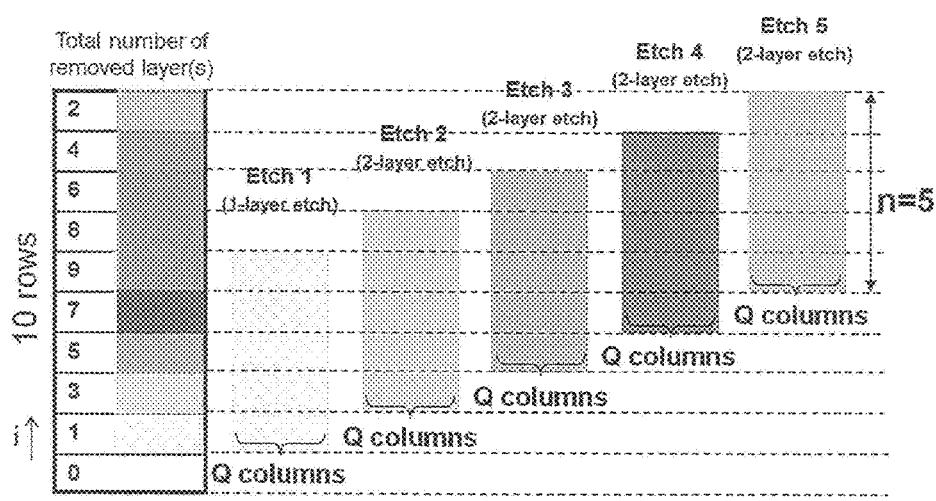
FIG. 13 illustrates the row definition steps of a method for fabricating a contact pad structure according to an embodiment where P=10 and a concave shape is formed.

FIG. 13 illustrates the row definition steps of a method for fabricating a contact pad structure according to an embodiment where P=10 and a concave shape is formed.

When P=10, n=5 (=P/2 as P is an even number), and d is the integer part (4) of (P−1)/2=4.5, which means that the row definition steps include four (=d) 2-layer etching steps and 5 (=n) rows of regions are etched in each of the 1-layer etching step and the four (=d) 2-layer etching steps.

Figure 14A:
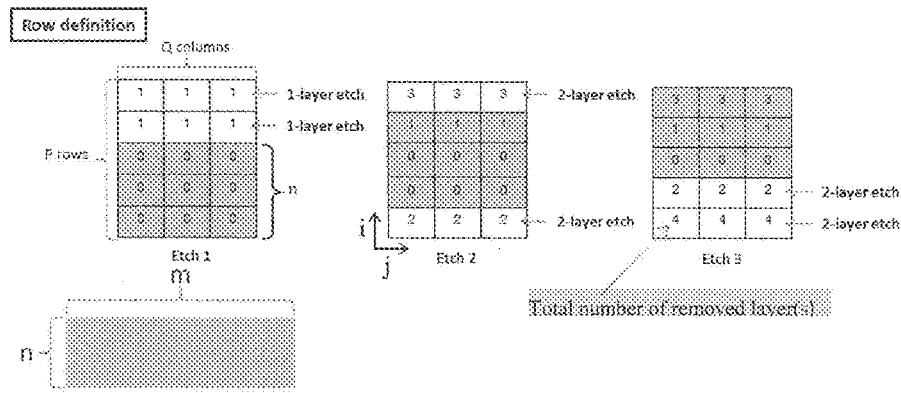
FIGS. 14A and 14B illustrate a method for fabricating a contact pad structure according to an embodiment where P=5 and a protrusion shape is formed.
Figure 14B:
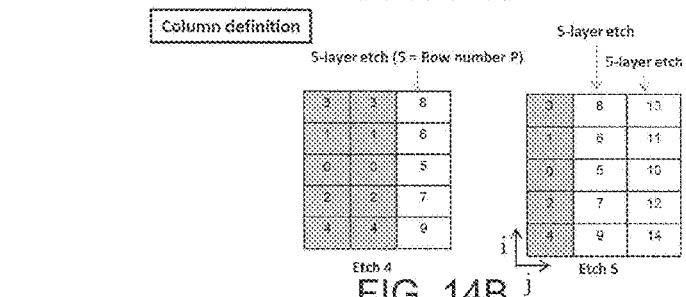

FIGS. 14A and 14B illustrate a method for fabricating a contact pad structure according to an embodiment where P=5 and a protrusion shape is formed. The above targeted regions are masked when a protrusion shape is to be formed.

The process as shown in FIGS. 14A and 14B is different from the process as shown in FIGS. 10A and 10B in that the target regions are masked, instead of being exposed and etched, in each etching step, n=(P+1)/2 as P is an odd number, and the row definition etching starts from the first row, i.e., the regions (1, j) to (n, j) (j=1 to Q) are targeted regions in the 1-layer etching process, as P is an odd number. The number $Tn_{i,j}$ of the conductive layer(s) being removed in each region is also shown in the figure.

Figure 15:
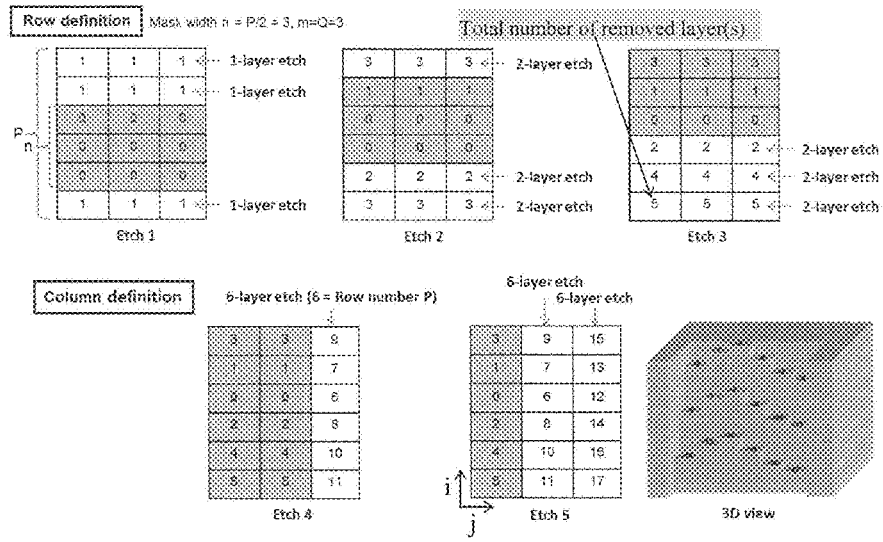
FIG. 15 illustrates a method for fabricating a contact pad structure according to an embodiment where P=6 and a protrusion shape is formed.

FIG. 15 illustrates a method for fabricating a contact pad structure according to an embodiment where P=6 and a protrusion shape is formed.

The process as shown in FIG. 15 is different from the process as shown in FIG. 11 in that the target regions are masked, instead of being exposed and etched, in each etching step. The number $Tn_{i,j}$ of the conductive layer(s) being removed in each region is also shown in the figure.

Figure 16:
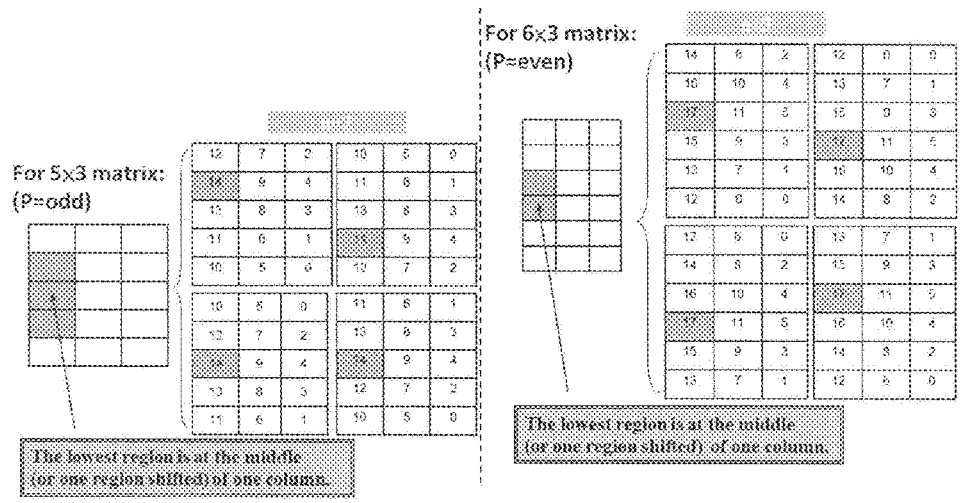
FIG. 16 illustrates the number $Tn_{i,j}$ of the conductive layer(s) requiring to be removed in each region in various embodiments where a concave shape is formed and P is 5 or 6.
Figure 17:
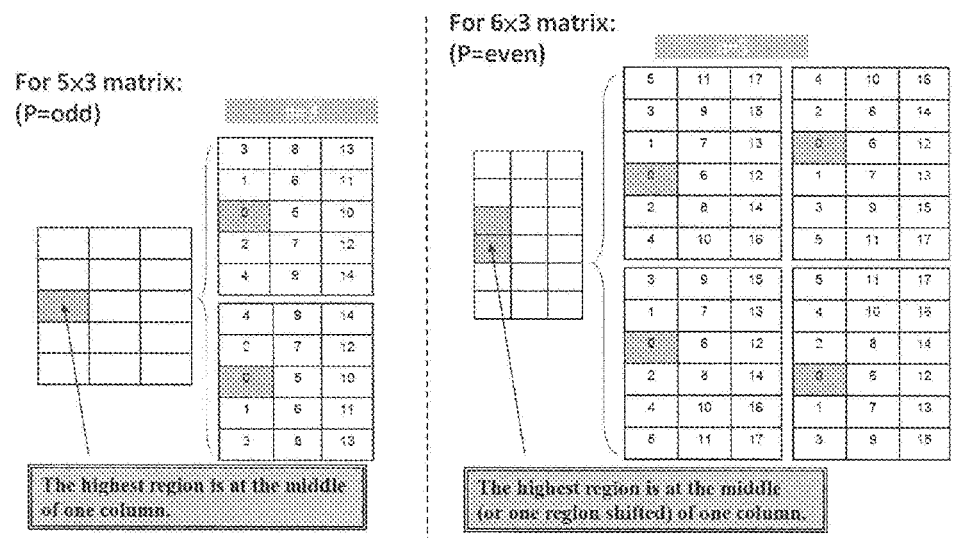
FIG. 17 illustrates the number $Tn_{i,j}$ of the conductive layer(s) requiring to be removed in each region in various embodiments where a protrusion shape is formed and P is 5 or 6.

The cases of P=4, P=7 and P=9, respectively, for the concave shape, and the cases of P=4, P=7, P=8 and P=9, respectively, for the protrusion shape have also been investigated, and the results are shown in FIG. 16 and FIG. 17, respectively.

FIG. 16 illustrates the number $Tn_{i,j}$ of the conductive layer(s) requiring to be removed in each region in various embodiments where a concave shape is formed and P is 5 or 6. In addition, the number $Tn_{i,1}$ (i=1 to P) for the first column of regions in certain embodiments where P ranges from 4 to 9 are list in Table 1 below. The number n of the etched rows in each of the 1-layer etching step and the 2-layer etching step(s), and the number d [integer part of (P−1)/2] of the 2-layer etching step(s) are indicated by the equalities shown in the parentheses.

TABLE 1

| | P-value | | | | | |
|---|---|---|---|---|---|---|
| i | 4 | 5 | 6 | 7 | 8 | 9 |
| 9 | | | | | | 2 |
| 8 | | | | | 2 (= 2 × 1) | 4 (= 2 × 2) |
| 7 | | | | 2 (= 2 × 1) | 4 (= 2 × 2) | 6 (= 2 × 3) |
| 6 | | | 2 (= 2 × 1) | 4 (= 2 × 2) | 6 (= 2 × 3) | 8 (= 2 × 4) |
| 5 | | 2 (= 2 × 1) | 4 (= 2 × 2) | 6 (= 2 × 3) | 7 (= 1 + 2 × 3) | 7 (= 1 + 2 × 3) |
| 4 | 2 (= 2 × 1) | 4 (= 2 × 2) | 5 (= 1 + 2 × 2) | 5 (= 1 + 2 × 2) | 5 (= 1 + 2 × 2) | 5 (= 1 + 2 × 2) |

TABLE 1-continued

| i | P-value | | | | | |
|---|---|---|---|---|---|---|
|   | 4 | 5 | 6 | 7 | 8 | 9 |
| 3 | 3 (= 1 + 2 × 1) | 3 (= 1 + 2 × 1) | 3 (= 1 + 2 × 1) | 3 (= 1 + 2 × 1) | 3 (= 1 + 2 × 1) | 3 (= 1 + 2 × 1) |
| 2 | 1 | 1 | 1 | 1 | 1 | 1 |
| 1 | 0 | 0 | 0 | 0 | 0 | 0 |

According to FIG. 16 and Table 1, the concave shape has a central lowest point at an h-th region that is at the middle of a column or is one region shifted from the middle of a column. For example, when P is 5, the 3-rd, 2-nd or 4-th region (h is 3, 2 or 4) is the lowest in a column, and when P is 8, the 4-th or 5-th region (h is 4 or 5) is the lowest in a column. In addition, a rule can be found that $Tn_{1,1}=0$, $Tn_{h,1}=P-1$, $Tn_{i,1}$ (i=h−1 to 2) is P−|i−h⊕×2 when $Tn_{i,1}$ (i=h+1 to P) is P−1−|i−h|×2 or is P−1−|i−h|×2 when $Tn_{i,1}$ (i=h+1 to P) is P−|i−h|×2. $Tn_{i,j}$ (i≥1, j>1) can be calculated as $Tn_{i,1}+(j-1)\times P$.

FIG. 17 illustrates the number $Tn_{i,j}$ of the conductive layer(s) requiring to be removed in each region in various embodiments where a protrusion shape is formed and P is 5 or 6. In addition, the number $Tn_{i,1}$ (i=1 to P) for the first column of regions in certain embodiments where P ranges from 4 to 9 are list in Table 2 below. The number n of the masked rows in each of the 1-layer etching step and the 2-layer etching step(s), and the number d [integer part of (P−1)/2] of the 2-layer etching step(s) are also indicated by the equalities shown in the parentheses.

TABLE 2

| i | P-value | | | | | |
|---|---|---|---|---|---|---|
|   | 4 | 5 | 6 | 7 | 8 | 9 |
| 9 |   |   |   |   |   | 7 (= 1 + 2 × 3) |
| 8 |   |   |   |   | 5 (= 1 + 2 × 2) | 5 (= 1 + 2 × 2) |
| 7 |   |   |   | 5 (= 1 + 2 × 2) | 3 (= 1 + 2 × 1) | 3 (= 1 + 2 × 1) |
| 6 |   |   | 3 (= 1 + 2 × 1) | 3 (= 1 + 2 × 1) | 1 | 1 |
| 5 |   | 3 (= 1 + 2 × 1) | 1 | 1 | 0 | 0 |
| 4 | 1 | 1 | 0 | 0 | 2 (= 2 × 1) | 2 (= 2 × 1) |
| 3 | 0 | 0 | 2 (= 2 × 1) | 2 (= 2 × 1) | 4 (= 2 × 2) | 4 (= 2 × 2) |
| 2 | 2 (= 2 × 1) | 2 (= 2 × 1) | 4 (= 2 × 2) | 4 (= 2 × 2) | 6 (= 2 × 3) | 6 (= 2 × 3) |
| 1 | 3 (= 1 + 2 × 1) | 4 (= 2 × 2) | 5 (= 1 + 2 × 2) | 6 (= 2 × 3) | 7 (= 1 + 2 × 3) | 8 (= 2 × 4) |

According to FIG. 17 and Table 2, The protrusion shape has a central highest point at an h-th region that is at the middle of a column when P is an odd number, or is at the middle of a column or is one region shifted from the middle of a column when P is an even number. For example, when P is 6, the 3-rd or 4-th region (h is 3 or 4) is the lowest in a column, and when P is 9, the 5-th region (h is 5) at the middle [=(P+1)/2] is the lowest in a column. In addition, a rule can be found that $Tn_{i,1}$ is P−1, $Tn_{h,1}$ is 0, $Tn_{i,1}$ (i=h−1 to 2) is |i−h|×2 when $Tn_{i,1}$ (i=h+1 to P) is |i−h|×2+1, or is |i−h|×2+1 when $Tn_{i,1}$ (i=h+1 to P) is |i−h|×2, and $Tn_{i,1}$ (i=h+1 to P) is |i−h|×2+1. $Tn_{i,j}$ (i≥1, j>1) can be calculated as $Tn_{i,1}+(j-1)\times P$.

For the contact pad structure of this invention can be formed with much less than N−1 times (e.g., 4 times) of lithography and etching processes for N (e.g., 12) levels of devices, the formation process can be significantly simplified, and the process control is easier.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A contact pad structure, comprising alternately stacked N insulating layers (N≥6) and N conductive layers, and having N regions exposing the respective conductive layers, wherein the regions are arranged in a P×Q array (P≥3, Q≥2), and when the conductive layers are numbered from first to N-th from bottom to top, the conductive layer exposed in a region (i, j) is designated as an $Ln_{i,j}$-th conductive layer,
a difference in Ln between the P regions of the j-th column and the P regions of the (j+1)-th column is fixed, satisfying the relationship of $$Ln_{1,j}-Ln_{1,j+1}=Ln_{2,j}-Ln_{2,j+1}=\ldots=Ln_{P,j}-Ln_{P,j+1}=P,$$
and in the P regions of the j-th column, $|Ln_{i,j}-Ln_{i+1,j}|\leq 2$, and the P regions form an asymmetric structure having a concave shape or a protrusion shape.

2. The contact pad structure of claim 1, wherein the concave shape has a central lowest point at an h-th region that is at the middle of a column or is one region shifted from the middle of a column.

3. The contact pad structure of claim 2, wherein $Ln_{i,j}=N-Tn_{i,j}$, wherein $Tn_{i,j}$ is a number of the conductive layer(s) required to be removed,
$Tn_{1,1}=0$,
$Tn_{h,1}=P-1$,
$Tn_{i,1}$ (i=h−1 to 2) is P−|i−h|×2 when $Tn_{i,1}$ (i=h+1 to P) is P−1−|i−h|×2,
$Tn_{i,1}$ (i=h+1 to P) is P−|i−h|×2 when $Tn_{i,1}$ (i=h−1 to 2) is P−1−|i−h|×2, and
$Tn_{i,j}$ (i≥1, j>1) is $Tn_{i,1}+(j-1)\times P$.

4. The contact pad structure of claim 1, wherein the asymmetric structure having the protrusion shape is disposed on a surface lower than adjacent surfaces.

5. The contact pad structure of claim 1, wherein the asymmetric structure having the protrusion shape is disposed on a surface coplanar with adjacent surfaces.

6. The contact pad structure of claim 1, wherein the protrusion shape has a central highest point at an h-th region that is at the middle of a column when P is an odd number, or is at the middle of a column or is one region shifted from the middle of a column when P is an even number.

7. The contact pad structure of claim 6, wherein $Ln_{i,j}=N-Tn_{i,j}$, wherein $Tn_{i,j}$ is a number of the conductive layer(s) required to be removed, $Tn_{1,1}$ is P−1

$Tn_{h,1}$ is 0

$Tn_{i,1}$ (i=h−1 to 2) is $|i-h|\times 2$ when $Tn_{i,1}$ (i=h+1 to P) is $|i-h|\times 2+1$, $Tn_{i,1}$ (i=h−1 to 2) is $|i-h|\times 2+1$ when $Tn_{i,1}$ (i=h+1 to P) is $|i-h|\times 2$, and $Tn_{i,j}$ (i≥1, j>1) is $Tn_{i,1}+(j-1)\times P$.

8. The contact pad structure of claim 7, which is disposed adjacent to a word-line pad in a 3D memory.

9. A method for fabricating a contact pad structure, wherein the contact pad structure comprises alternately stacked N insulating layers (N≥6) and N conductive layers, and has N regions exposing the respective conductive layers, the regions are arranged in a P×Q array (P>3, Q≥2), and when the conductive layers are numbered from first to N-th from bottom to top, the conductive layer exposed in a region (i, j) is designated as an $Ln_{i,j}$-th conductive layer, the method comprising:

removing one conductive layer while the regions (2, j) to (1+n, j) (j=1 to Q) are targeted regions, wherein n is P/2 when P is an even number, or is (P−1)/2 when P is an odd number;

d step(s) of removing two conductive layers while the regions (2+b, j) to (1+n+b, j) (j=1 to Q) are targeted regions, wherein d is an integer part of (P−1)/2, and b is a different integer among the integers of 1 to d in each of the d step(s); and Q−1 step(s) of removing P conductive layers while the regions (i, 1+c) to (i, Q) (i=1 to P) are targeted regions, wherein c is a different integer among the integers of 1 to Q−1, wherein the targeted regions are exposed and etched.

10. A method for fabricating a contact pad structure, wherein the contact pad structure comprises alternately stacked N insulating layers (N≥6) and N conductive layers, and has N regions exposing the respective conductive layers, the regions are arranged in a P×Q array (P>3, Q≥2), and when the conductive layers are numbered from first to N-th from bottom to top, the conductive layer exposed in a region (i, j) is designated as an $Ln_{i,j}$-th conductive layer, the method comprising:

removing one conductive layer, while the regions (2, j) to (1+n, j) (j=1 to Q) are targeted regions, in which n=P/2, when P is an even number, or while the regions (1, j) to (n, j) (j=1 to Q) are targeted regions, in which n=(P+1)/2, when P is an odd number;

d step(s) of removing two conductive layers, while the regions (2+b, j) to (1+n+b, j) (j=1 to Q) (n=P/2) are targeted regions when P is an even number, or while the regions (1+b, j) to (n+b, j) (j=1 to Q) (n=(P+1)/2) are targeted regions when P is an odd number, wherein d is an integer part of (P−1)/2, and b is a different integer among the integers of 1 to d in each of the d step(s); and Q−1 step(s) of removing P conductive layers while the regions (i, 1+c) to (i, Q) (i=1 to P) are targeted regions, wherein c is a different integer among the integers of 1 to Q−1, wherein the targeted regions are masked.

11. The method of claim 9, which is applied to manufacture of a 3D memory.

12. The method of claim 10, which is applied to manufacture of a 3D memory.

* * * * *